United States Patent
Ke et al.

(10) Patent No.: US 11,665,889 B2
(45) Date of Patent: May 30, 2023

(54) SEMICONDUCTOR MEMORY STRUCTURE

(71) Applicant: Winbond Electronics Corp., Taichung (TW)

(72) Inventors: Shuen-Hsiang Ke, Taichung (TW); Shih-Chieh Lin, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 51 days.

(21) Appl. No.: 17/523,439

(22) Filed: Nov. 10, 2021

(65) Prior Publication Data
US 2022/0068654 A1    Mar. 3, 2022

Related U.S. Application Data

(62) Division of application No. 16/810,135, filed on Mar. 5, 2020, now Pat. No. 11,205,574.

(51) Int. Cl.
| | |
|---|---|
| *H01L 27/10* | (2006.01) |
| *H01L 21/308* | (2006.01) |
| *H01L 21/02* | (2006.01) |
| *H01L 21/768* | (2006.01) |
| *H01L 21/033* | (2006.01) |
| *H01L 21/48* | (2006.01) |

(52) U.S. Cl.
CPC ..... *H10B 12/488* (2023.02); *H01L 21/02362* (2013.01); *H01L 21/0337* (2013.01); *H01L 21/308* (2013.01); *H01L 21/3086* (2013.01); *H01L 21/4885* (2013.01); *H01L 21/76816* (2013.01); *H01L 21/76877* (2013.01); *H01L 21/76897* (2013.01); *H10B 12/482* (2023.02)

(58) Field of Classification Search
CPC .......... H01L 21/3086; H01L 21/02362; H01L 21/0337; H01L 21/308; H01L 21/4885; H01L 21/76816; H01L 21/76877; H01L 21/76897; H01L 21/31144; H10B 12/482; H10B 12/488; H10B 12/053; H10B 12/34
See application file for complete search history.

(56) References Cited

U.S. PATENT DOCUMENTS

| | | | |
|---|---|---|---|
| 7,435,677 B2 | 10/2008 | Choi | |
| 8,039,896 B2 * | 10/2011 | Seo | ......................... H10B 12/34 257/E21.655 |
| 8,772,866 B2 | 7/2014 | Hong | |

(Continued)

FOREIGN PATENT DOCUMENTS

| | | |
|---|---|---|
| TW | 200733225 A | 9/2007 |
| TW | 201913731 A | 4/2019 |

*Primary Examiner* — Shouxiang Hu
(74) *Attorney, Agent, or Firm* — Muncy, Geissler, Olds & Lowe, P.C.

(57) ABSTRACT

A method for forming a semiconductor memory structure includes forming a hard mask layer over a semiconductor substrate, etching the hard mask layer to form first mask patterns and second mask patterns, transferring the first and second mask patterns to the substrate to form semiconductor blocks, and thinning down the second mask element. After thinning down the second mask element, the thickness of the second mask elements is less than the thickness of the first mask elements. The method also includes forming a first capping layer to laterally extend over the first mask patterns and the second mask patterns, and etching the first capping layer and the second mask pattern to form contact openings.

19 Claims, 16 Drawing Sheets

(56) References Cited

U.S. PATENT DOCUMENTS

| | | |
|---|---|---|
| 9,607,994 B2 | 3/2017 | Kim et al. |
| 10,985,166 B2 * | 4/2021 | Wang .................. H10B 12/485 |
| 11,037,930 B2 * | 6/2021 | Park .................... H10B 12/482 |
| 2004/0238867 A1 | 12/2004 | Park |
| 2006/0022256 A1 | 2/2006 | Lee et al. |
| 2018/0261540 A1 | 9/2018 | Lee et al. |

* cited by examiner

SEMICONDUCTOR MEMORY STRUCTURE

CROSS REFERENCE TO RELATED APPLICATIONS

This application is a Divisional Application of U.S. patent application Ser. No. 16/810,135, filed on Mar. 5, 2020.

BACKGROUND

Field of the Disclosure

The present disclosure relates to a semiconductor memory structure, and in particular, it relates to a Dynamic Random Access Memory.

Description of the Related Art

Dynamic Random Access Memory (DRAM) devices are widely used in consumer electronic products. In order to increase element density in a DRAM device and improve its overall performance, existing technologies for fabricating DRAM devices continue to focus on scaling down the size of the elements.

However, in scaling down the size of the minimum elements, new challenges arise. For example, an opening for a conductive feature (e.g. a contact plug) may be formed using photolithography and etching processes. However, the overlay shift of a photolithography process may cause a short circuit between the conductive features within the same layer (plane). Therefore, there is a need in the industry to improve the method of fabricating DRAM devices to overcome problems caused by scaling down the size of the elements.

SUMMARY

In some embodiments of the disclosure, a method for forming a semiconductor memory structure is provided. The method includes forming a hard mask layer over a semiconductor substrate, etching the hard mask layer to form a plurality of first mask patterns and a plurality of second mask patterns, transferring the plurality of first and plurality of second mask patterns to the substrate to form a plurality of semiconductor blocks, and thinning down the plurality of second mask element. After thinning down the plurality of second mask element a thickness of the plurality of second mask elements is less than a thickness of the plurality of first mask elements. The method also includes forming a first capping layer to laterally extend over the plurality of first mask patterns and the plurality of second mask patterns, and etching the first capping layer and the plurality of second mask pattern to form contact openings.

In some embodiments of the disclosure, a semiconductor memory structure is provided. The semiconductor memory structure includes an active region of a semiconductor substrate, and the active region comprises a first semiconductor block. The semiconductor memory structure also includes a word line disposed adjacent to the first semiconductor block in the semiconductor substrate, a mask pattern disposed over the first semiconductor block, and a capping layer disposed alongside the mask pattern and in the semiconductor substrate to abut the word line. An upper surface of the capping layer is substantially coplanar with an upper surface of the mask pattern.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Throughout the various views and illustrative embodiments, like reference numbers are used to designate like elements.

Figure 1:
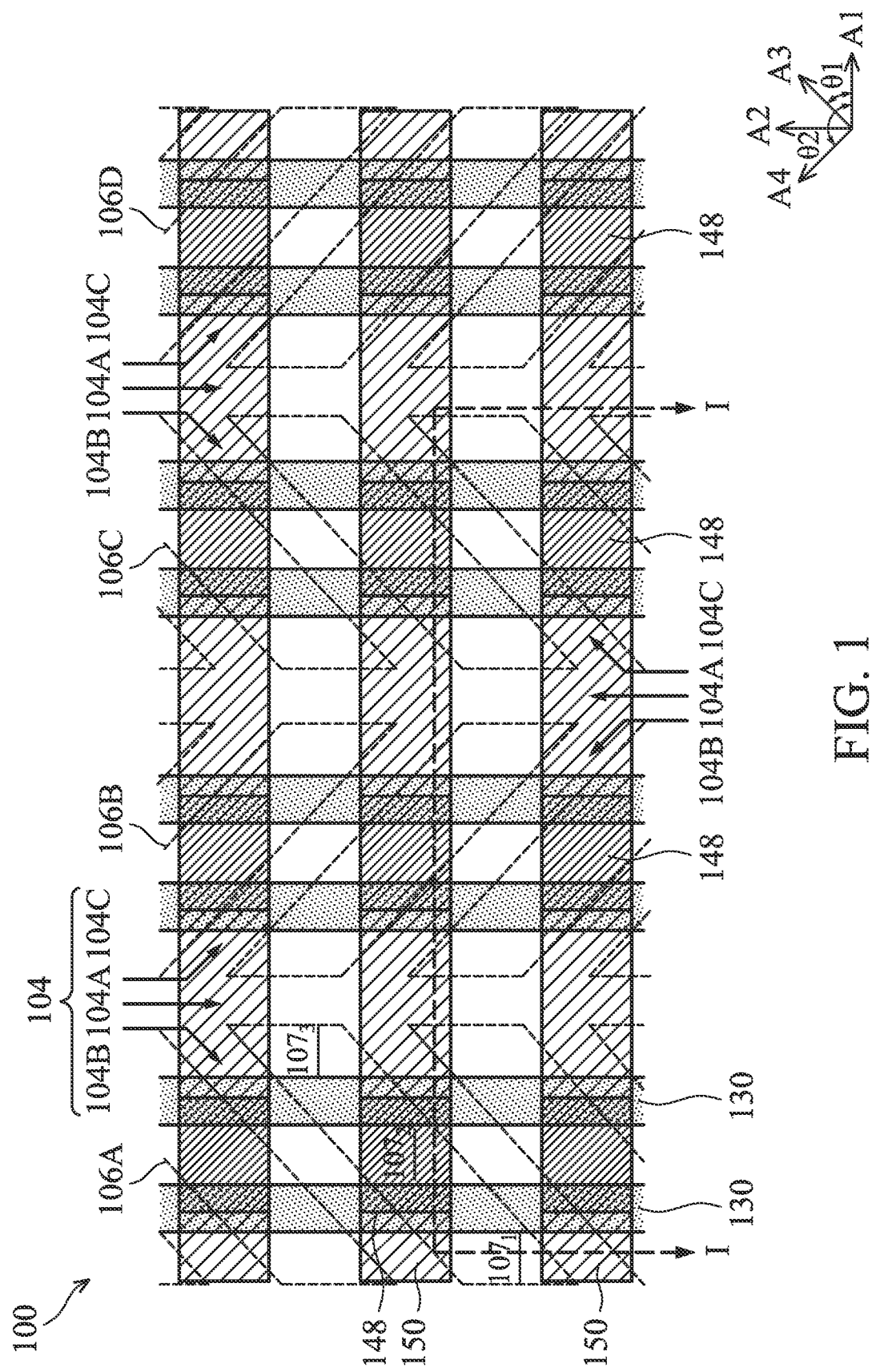
FIG. 1 is a top view of a semiconductor memory structure in accordance with some embodiments of the present disclosure.

FIG. 1 is a top view of a semiconductor memory structure in accordance with some embodiments of the present disclosure. A semiconductor emo structure 100 is provided, as shown in FIG. 1, in accordance with some embodiments. In some embodiments, the semiconductor memory structure 100 is a portion of a DRAM. The semiconductor memory structure 100 includes isolation structures 104, active regions 106, word lines 130, contact plugs 148, and bit lines 150, in accordance with some embodiments. FIG. 1 only shows the above features for illustrative purpose, and other features are shown in the cross-sectional view of FIG. 16 that is taken along line I-I in FIG. 1.

The isolation features 104 are formed in the semiconductor substrate and include isolation features 104A, isolation features 104B and isolation features 104C, in accordance with some embodiments. The isolation features 104A extend along a direction D2 and are arranged in a direction A1, in accordance with some embodiments. The isolation features 1048 extend along a direction A3 and the isolation features 104C extend along a direction A4, in accordance with some embodiments. The isolation features 104B and the isolation features 104C each are arranged in the direction A2 and alternately arranged in the direction A1, in accordance with some embodiments.

The direction A1 is substantially perpendicular to the direction A2, the direction A1 intersects the direction A3 at an acute anule θ1, and the direction A1 intersects the direction A4 at an obtuse angle θ2, in accordance with some embodiments.

The isolation features 104 define a plurality of active regions 106A, 106B, 106C and 106D in the semiconductor substrate 102, in accordance with some embodiments. The active regions 106A-106D are arranged in order along the direction A1, in accordance with some embodiments. One active region 106A and one active region 106C are defined by two isolation region 104A and two isolation region 104B, and one active region 106B and one active region 106D is defined by two isolation region 104A and two isolation region 104C, in accordance with some embodiments.

The bit lines 150 are formed over the semiconductor substrate and extend along the direction A1, in accordance with some embodiments. The bit lines 150 are arranged corresponding to the active regions 104, in accordance with some embodiments. The word lines 130 formed in the semiconductor substrate and extend along the direction A2, in accordance with some embodiments. The word lines 130 are arranged in the direction A1 in a way that one pair of the word lines 130 corresponds to one region 106, in accordance with some embodiments. One word line 130 divide one active region 106 into three semiconductor blocks $107_1$, $107_2$, and $107_3$, wherein the semiconductor block $107_2$ is between the semiconductor block $107_1$ and the semiconductor block $107_3$, in accordance with some embodiments.

The contact plugs 148 are formed at cross points of the bit lines 150 and the active regions 106A-106D, in accordance with some embodiments. When a bit line 150 is cross a pair of adjacent word lines 130, the bit line 150 is in electric connection with the semiconductor block 107 of an active region 106 through a contact plug 148.

FIGS. 2-16 illustrate cross-sectional views of forming a semiconductor memory structure at various stages in accordance with some embodiments of the present disclosure.

Figure 2:
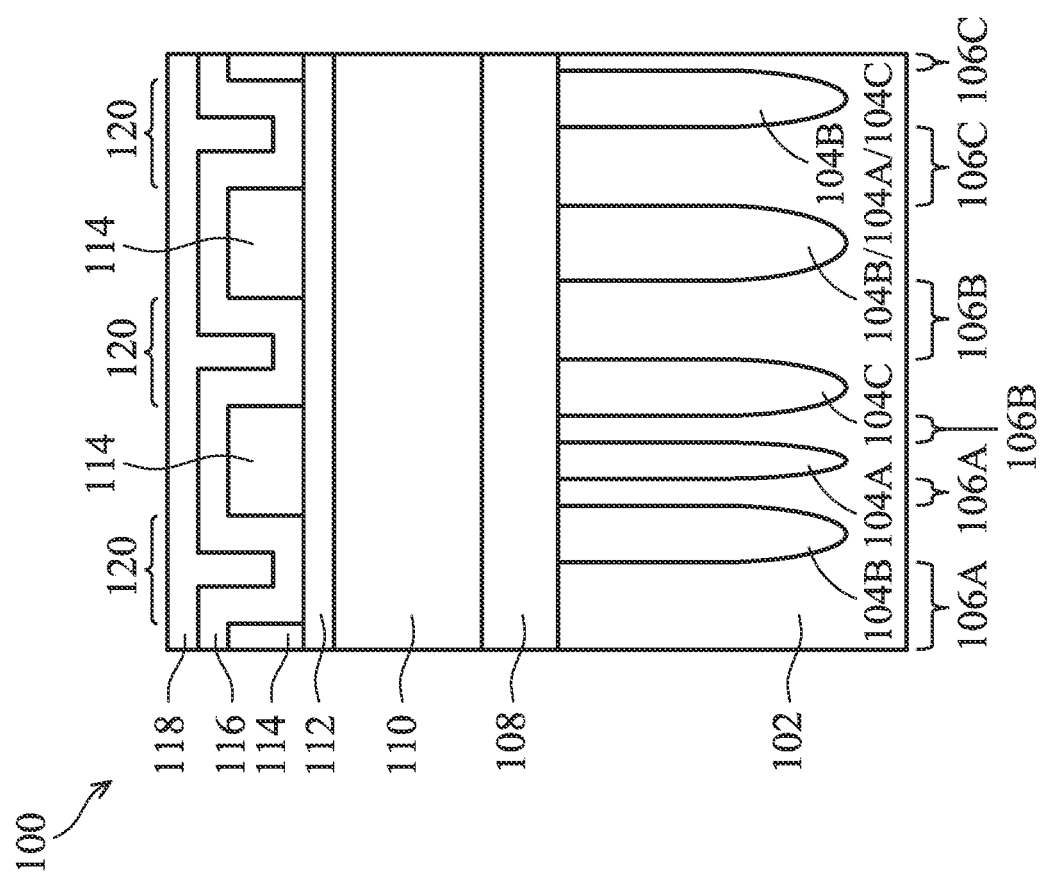
FIGS. 2-16 illustrate cross-sectional views of forming a semiconductor memory structure at various stages in accordance with some embodiments of the present disclosure.

FIGS. 2-16 illustrate cross-sectional views of forming a semiconductor memory structure at various stages in accordance with some embodiments of the present disclosure. The cross-sectional views of FIGS. 2-16 are taken along line I-I in FIG. 1. A semiconductor memory structure 100 is provided, as shown in FIG. 2, in accordance with some embodiments. The memory structure 100 includes a semiconductor substrate 102, in accordance with some embodiments. In some embodiments, the semiconductor substrate 102 is an elemental semiconductor substrate, such as a silicon substrate or a germanium substrate; or a compound semiconductor substrate, such as a silicon carbide substrate or a gallium arsenide substrate. In some embodiments, the semiconductor substrate 102 is a semiconductor-on-insulator (SOI) substrate.

Isolation features 104A, 104B and 104C are formed in the semiconductor substrate, as shown in FIGS. 1 and 2, in accordance with some embodiments. The isolation features 104 extends downwardly from the upper surface of the semiconductor substrate 102 so as to define active regions 106A, 106B, 106C and 106D (the active regions 106D not shown in FIGS. 2-16), in accordance with some embodiments. In some embodiments, the isolation features 104 are made of silicon oxide (SiO), silicon nitride (SiN), silicon oxynitride and/or a combination thereof. In some embodiments, the isolation features 104 are formed using a patterning process such as including photolithography and etching processes, a deposition process such as chemical vapor deposition (CVD), and a planarization process such as chemical mechanical polish (CMP).

A multi-layered hard mask layer is formed over the semiconductor substrate 102, in accordance with some embodiments. The multi-layered hard mask layer includes a first hard mask layer 108, a second hard mask layer 110 and a third hard mask layer 112, as shown in FIG. 2, in accordance with some embodiments. In some embodiments, the multi-layered hard mask layer is to be patterned into mask patterns that are used to define trenches for forming word lines.

In some embodiments, the first hard mask layer 108 are made of an oxide such as silicon oxide formed of tetraethylorthosilicate (TEOS). In some embodiments, the second hard mask layer 110 is made of carbon-rich material such as a carbon layer. In some embodiments, the third hard mask layer 112 is a nitride layer such as silicon nitride (SiN) or silicon oxynitride (SiON). In some embodiments, the first hard mask layer 108, the second hard mask layer 110 and the third hard mask layer 112 are formed using deposition processes such as CVD, atomic layer deposition (ALD) and/or a combination thereof.

A plurality of mask patterns 114 is formed over the upper surface of the third hard mask layer 112, as shown in FIG. 2, in accordance with sonic embodiments. The mask patterns 114 are arranged in the direction A1 (FIG. 1) and there are gaps 120 between the mask patterns 114, in accordance with sonic embodiments. In some embodiments, the mask patterns 114 are made semiconductor material (such as polysilicon). In some embodiments, the mask patterns 114 are formed by depositing a semiconductor material over the third hard mask layer 112 followed by photolithography and etching processes.

A conformal layer 116 is formed along the sidewalls and the upper surfaces of the mask patterns 114 and the upper surface of the third hard mask layer 112, as shown in FIG. 2, in accordance with some embodiments. The conformal layer 116 partially fills the gaps 120, as shown in FIG. 2, in accordance with some embodiments. In some embodiments, the conformal layer 116 is made of an oxide such as silicon oxide. In some embodiments, the conformal layer 116 is formed using low-temperature CVD (LTCVD).

A fill layer 118 is formed over the conformal layer 116, as shown in FIG. 2, in accordance with some embodiments. The fill layer 118 fills a remainder of the gaps 120, in accordance with some embodiments. In some embodiments, the fill layer 118 is made of a carbon-rich material such as spin-on coating (SOC) carbon. In some embodiments, the fill layer 118 is formed using a SOC process.

Figure 3:
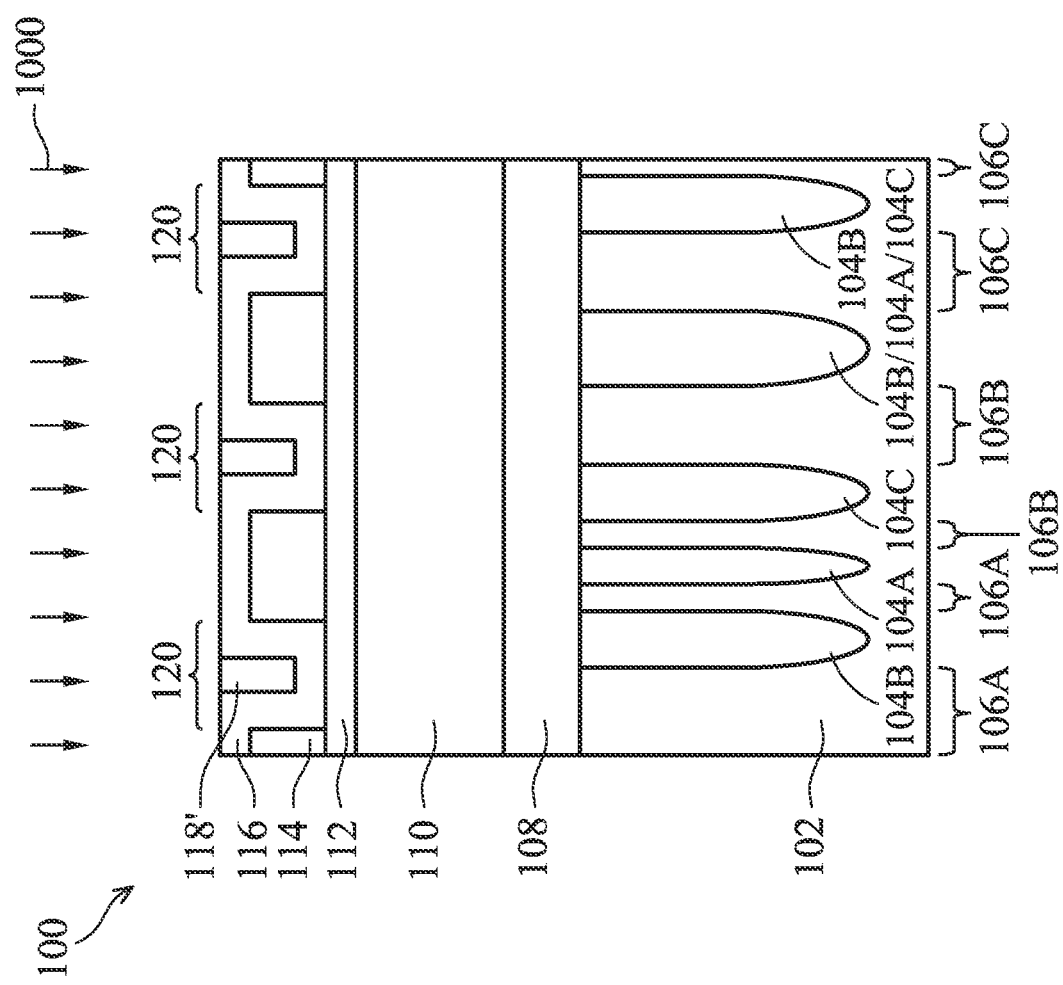

An etching step 1000 is performed on the semiconductor memory structure 100 to remove the fill layer 118 over the upper surface of the conformal layer 116 until the upper surface of the conformal layer 116 is exposed, as shown in FIG. 3, in accordance with some embodiments. A remainder of the fill layer 118 is denoted as a fill layer 118'. In some embodiments, the etching step 1000 is a dry etching in which an etchant such as $O_2$ and/or CO is used.

Figure 4:
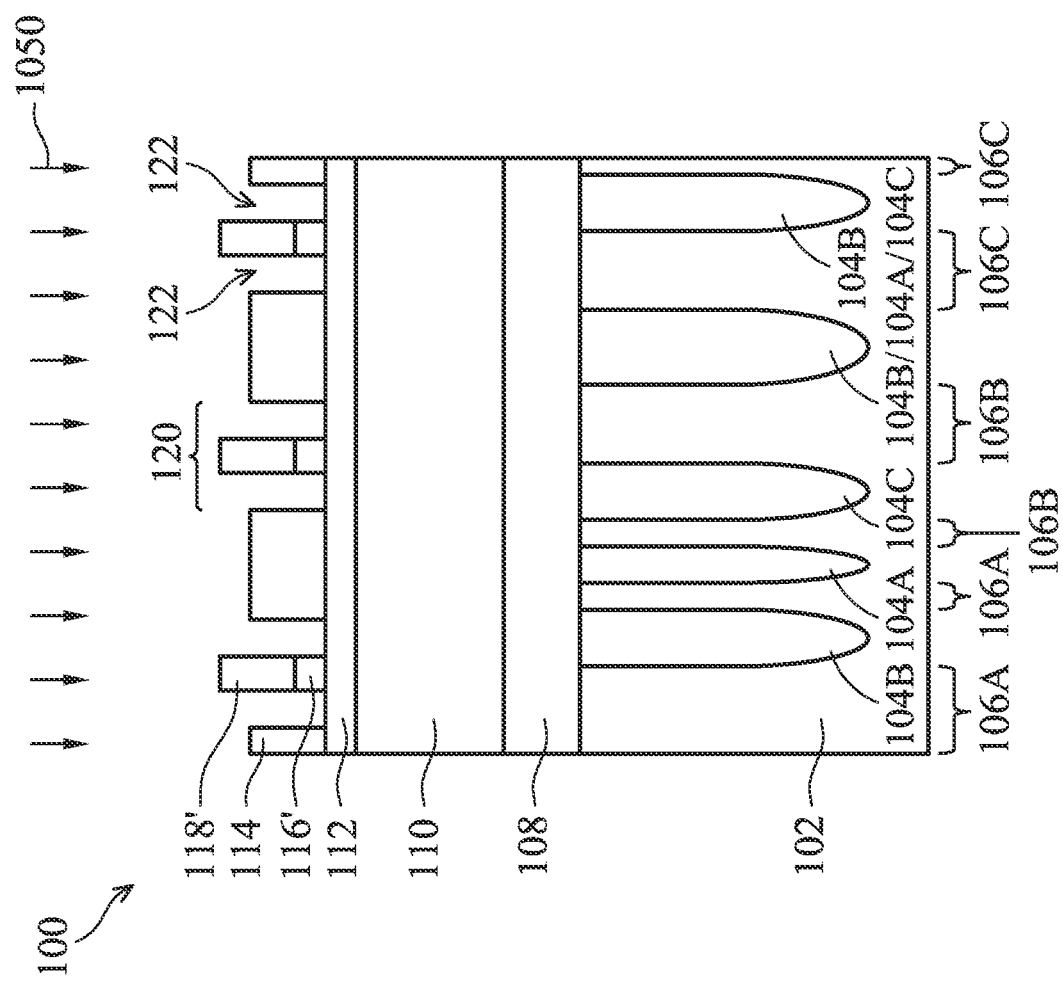

An etching step 1050 is performed on the semiconductor memory structure 100 to remove portions of the conformal layer 116 uncovered by the fill layer 118' until the upper surface of the third hard mask layer 112 is exposed, as shown in FIG. 4, in accordance with some embodiments. A remainder of the conformal layer 116 covered by the fill layer 118' is denoted as mask patterns 116'. In some embodiments, the etching step 1050 is a dry etching in which an etchant such as $CF_4$ and/or $CH_3$ is used.

The etching step 1050 creates a pair of trenches 122 within the gaps 120, in accordance with sonic embodiments. The pair of trenches 122 are separated from one another by the fill layer 118' and the mask pattern 116', in accordance with some embodiments.

Figure 5:
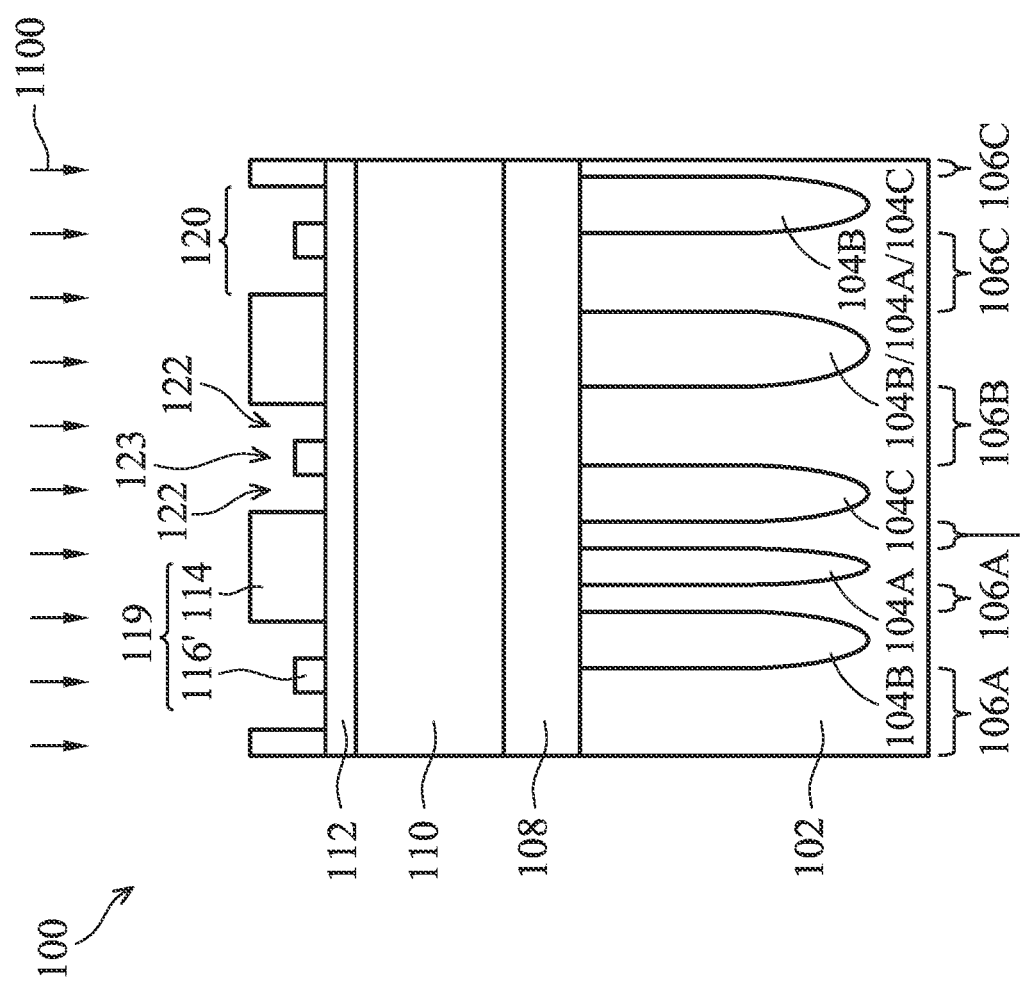

An etching step 1100 is performed on the semiconductor memory structure 100 to remove the remaining fill layer 118' until the upper surfaces of the mask patterns 116' are exposed, as shown in FIG. 5, in accordance with some embodiments. In some embodiments, the etching step 1100 is a dry etching in which an etchant such as $O_2$ is used. The mask patterns 114 and the mask patterns 116' are collectively referred to as a patterned layer 119, in accordance with some embodiments. In some embodiments, the mask patterns 114 and the mask patterns 116' are alternatingly arranged in the direction A1. In some embodiments, the width of the mask pattern 114 is greater than the width of the mask patterns 116' and the thickness of the mask pattern 114 is greater than the thickness of the mask patterns 116'.

The etching step 1100 creates a recess 123 above the mask pattern 116' between the pair of trenches 122 so that the pair of trenches 122 may be connected to one another through the recess 123, in accordance with some embodiments.

Figure 6:
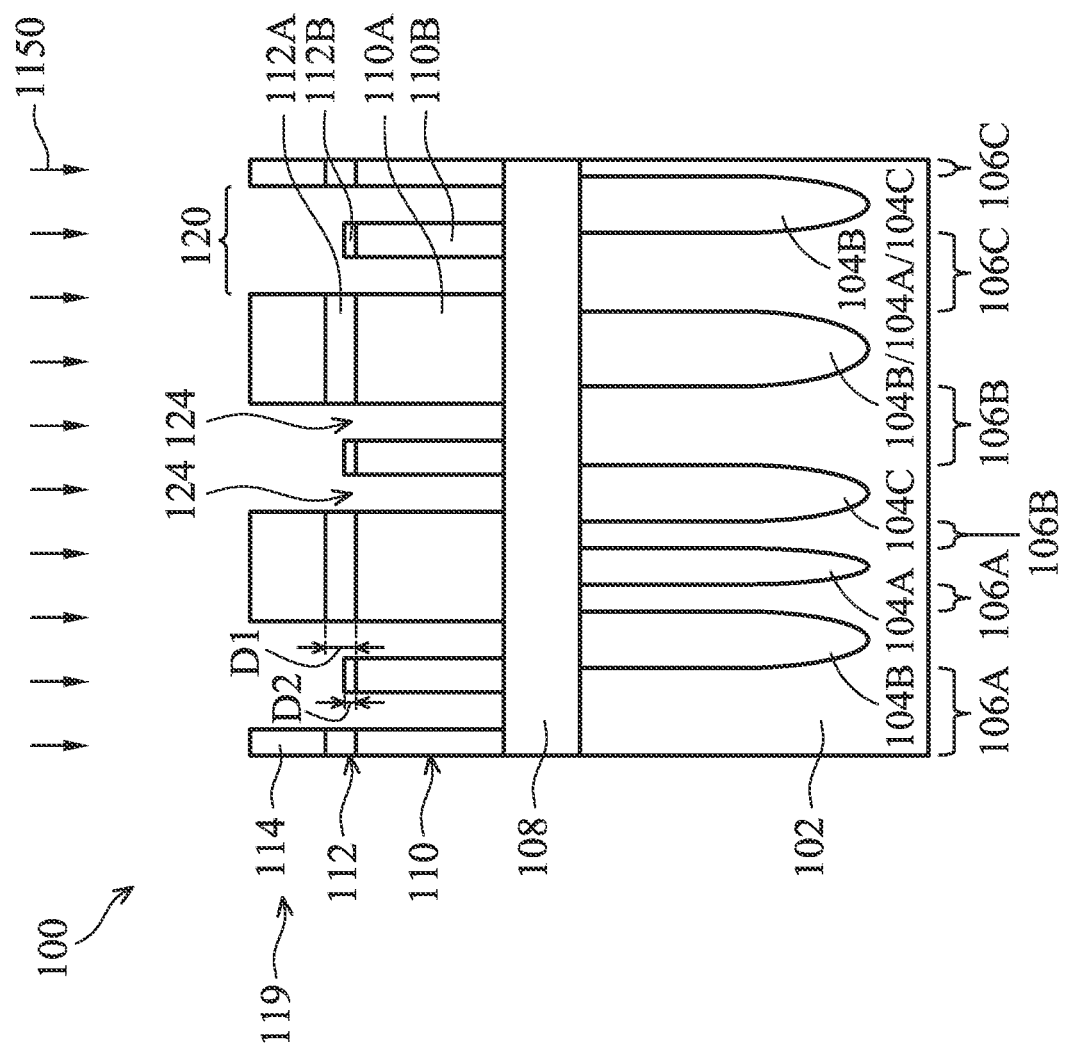

An etching step 1150 is performed on the semiconductor memory structure 100 using the patterned layer 119 to sequentially etch away portions of the third hard mask layer 112 and the second hard mask layer 110 uncovered by the mask patterns 114 and 116' until the upper surface of the lust hard mask layer 108 is exposed, as shown in FIG. 6, in accordance with some embodiments. In some embodiments, the etching step 1150 is a dry etching in which an etchant such as SF6 is used to etch the third hard mask layer 112 and an etchant such as $O_2$ is used to etch the second hard mask layer 110. In addition, the etching step 1150 extends the trenches 122 into the third hard mask layer 112 and the second hard mask layer 110 thereby forming trenches 124, in accordance with some embodiments.

The mask patterns 114 of the patterned layer 119 are transferred to the third hard mask layer 112 and the second hard mask layer 110 so that the third hard mask layer 112 is formed into mask patterns 112A and the second hard mask layer 110 is formed into mask patterns 110A, in accordance with some embodiments. The mask patterns 116' of the patterned layer 119 are transferred to the third hard mask layer 112 and the second hard mask layer 110 so that the third hard mask layer 112 is formed into mask patterns 112B and the second hard mask layer 110 is formed into mask patterns 110B, in accordance with some embodiments.

In some embodiments, the mask patterns 116' of the patterned layer 119 are substantially consumed during the etching step 1150, recessing the mask patterns 112B. As a result, the thickness D1 of the mask patterns 112A is greater than the thickness D2 of the mask patterns 112B. In some embodiments, the ratio of thickness D2 to thickness D1 is in a range from about 0.2 to about 0.4.

Figure 7:
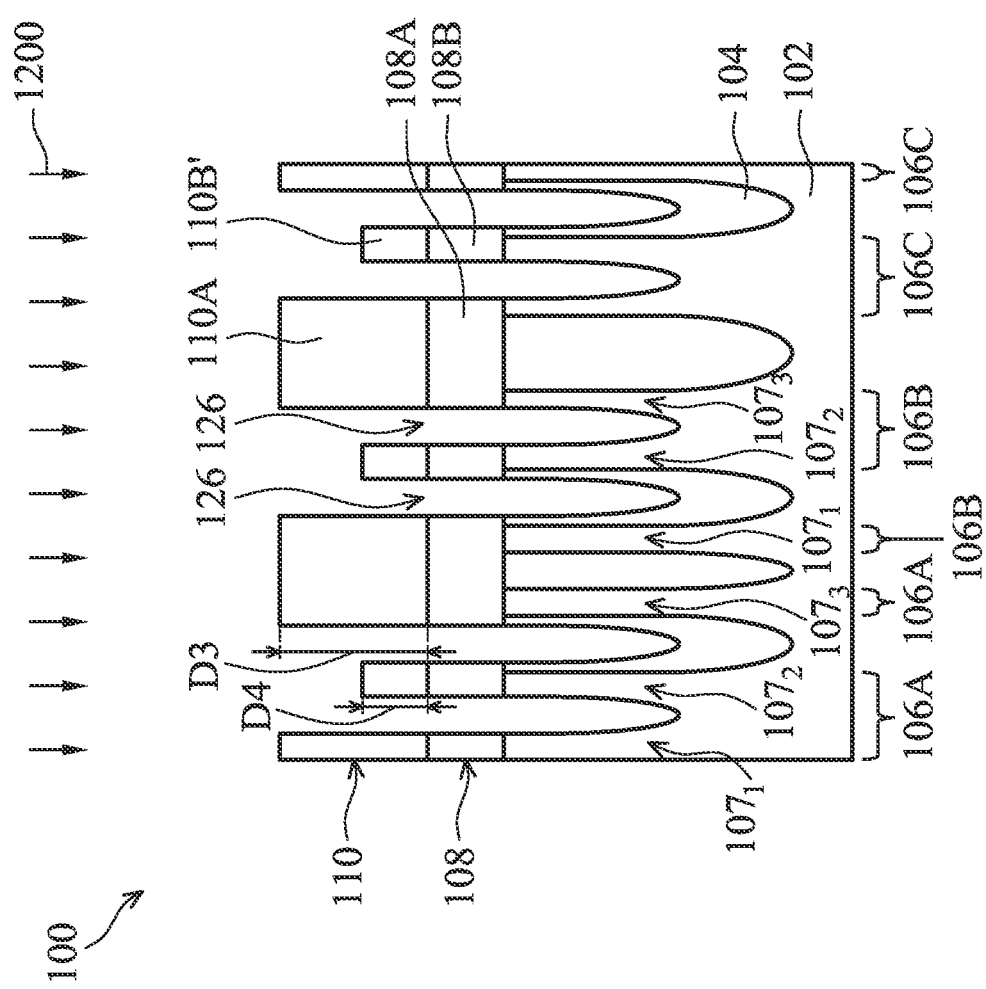

An etching step 1200 is performed on the semiconductor memory structure 100 using the second hard mask layer 110 to sequentially etch away portions of the first hard mask layer 108 and the semiconductor substrate 102 uncovered by the mask patterns 110A and 110B, as shown in FIG. 7, in accordance with some embodiments. In some embodiments, the etching step 1200 is a dry etching in Which an etchant such as $CF_3$ is used.

The etching step 1200 extends the trenches 124 into the first hard mask layer 108 and the semiconductor substrate 102 thereby forming trenches 126, as shown in FIG. 7, in accordance with some embodiments. The active regions 106A-106D are divided into semiconductor blocks $107_1$, $107_2$ and $107_3$, by the trenches 126, as shown in FIGS. 1 and 7, in accordance with some embodiments. Portions of the trenches 126 extend into the isolation features 104 in accordance with some embodiments. For example, portions of the trenches 126 pass through the isolation features 104E and 104C, as shown in FIGS. 1 and 7.

The mask patterns 110A of the second hard mask layer 110 are transferred to the first hard mask layer 108, and the first hard mask layer 108 is formed into mask patterns 108A, in accordance with some embodiments. The mask patterns 108A of the first hard mask layer 108 are then transferred to the semiconductor substrate 102 thereby forming a semiconductor block $107_1$ of an active region 106 and a semiconductor block $107_3$ of an adjacent active region 106, in accordance with some embodiments.

The mask patterns 110B of the second hard mask layer 110 are transferred to the first hard mask layer 108, and the first hard mask layer 108 is formed into mask patterns 108B, in accordance with some embodiments. The mask patterns 108B of the first hard mask layer 108 are then transferred to the semiconductor substrate 102 thereby forming a semiconductor block $107_2$ of an active region 106, in accordance with some embodiments. In some embodiments, the mask patterns 108A and the mask patterns 108B are alternatingly arranged in the direction A1.

In some embodiments, the mask patterns 114 of the patterned layer 119 and the third hard mask layer 112 are substantially consumed during the etching step 1200, and the mask patterns 110B of the second hard mask layer 110 are recessed. The recessed mask patterns 110B are denoted as mask patterns 110B'. In some embodiments, the thickness D3 of the mask patterns 110A is greater than the thickness D4 of the mask patterns 110B'. In some embodiments, the ratio of thickness D4 to thickness D3 is in a range from about 0.33 to about 0.5.

Figure 8:
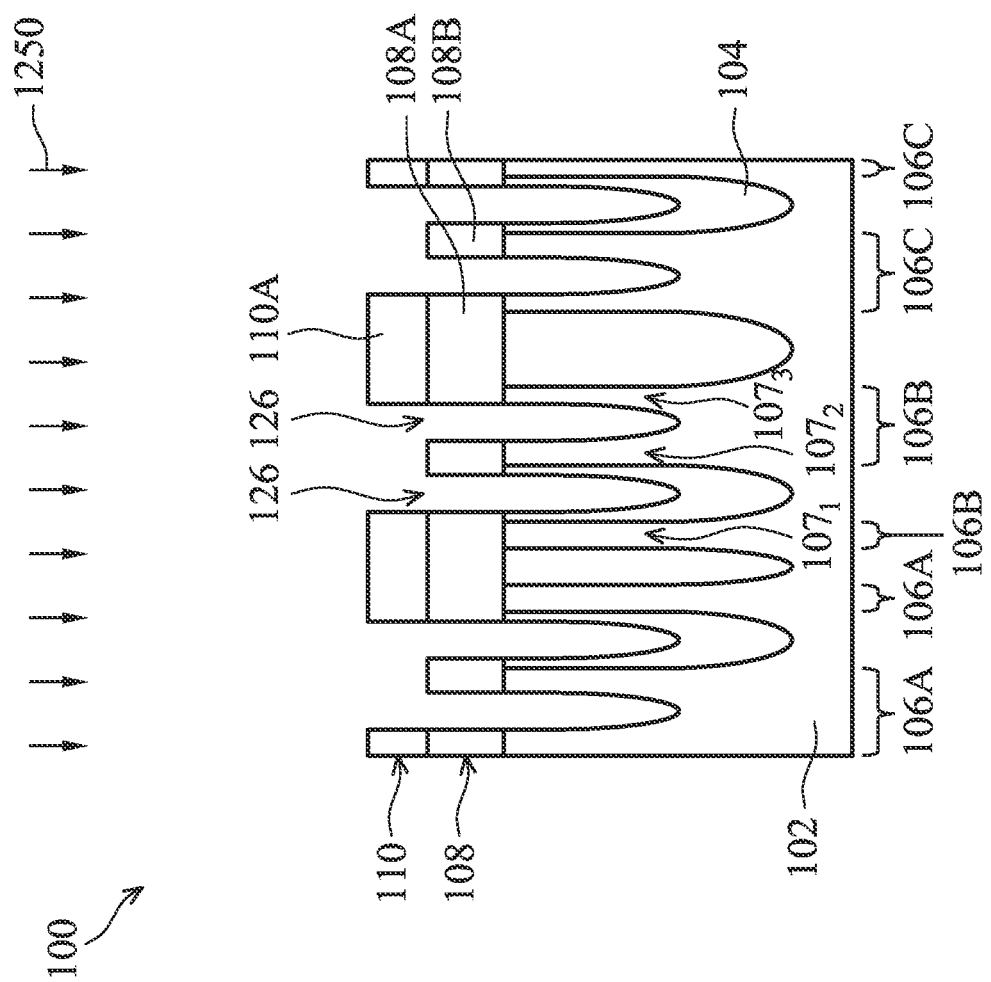

An etching step 1250 is performed on the semiconductor memory structure 100 to remove the mask patterns 110B' of the second hard mask layer 110 until the mask patterns 108B of the first hard mask layer 108 are exposed, as shown in FIG. 8. in accordance with some embodiments. In some embodiments, the etching step 1250 is a dry etching in which an etchant such as $O_2$ is used.

Figure 9:
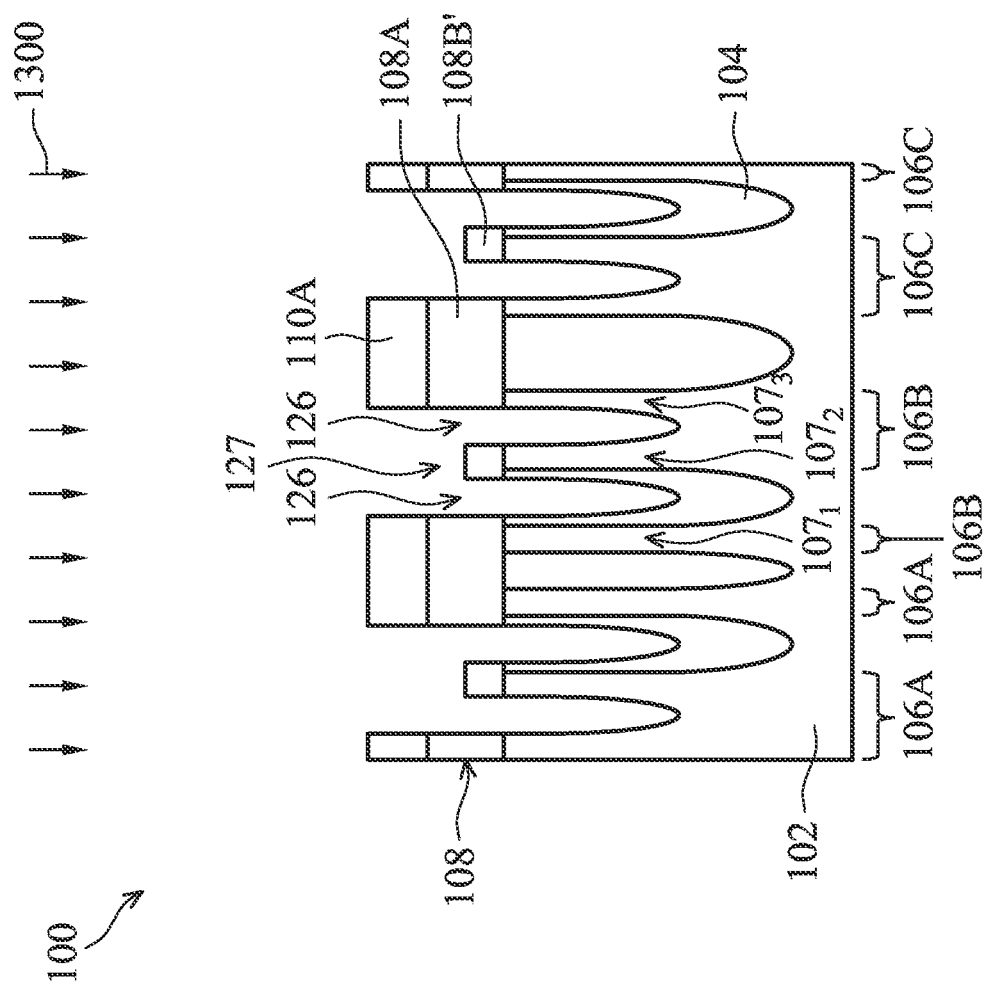

An etching step 1300 is performed on the semiconductor memory structure 100 to recess the mask patterns 108B of the first hard mask layer 108 to thin down the mask patterns 108B, as shown in FIG. 9, in accordance with some embodiments. In some embodiments, mask patterns 110A protect mask patterns 108A, and mask patterns 108A are not thinned down during the etching step 1300, in accordance with some embodiments. The recessed mask patterns 108B are denoted as mask patterns 108B'. The etching step 1300 creates a recess 127 above the mask pattern 108B' connecting a pair of trenches 126 together through the recess 127, in accordance with some embodiments. In some embodiments, the etching step 1300 is a dry etching in which an etchant such as $CF_4$ and/or $CHF_3$ is used.

Figure 10:
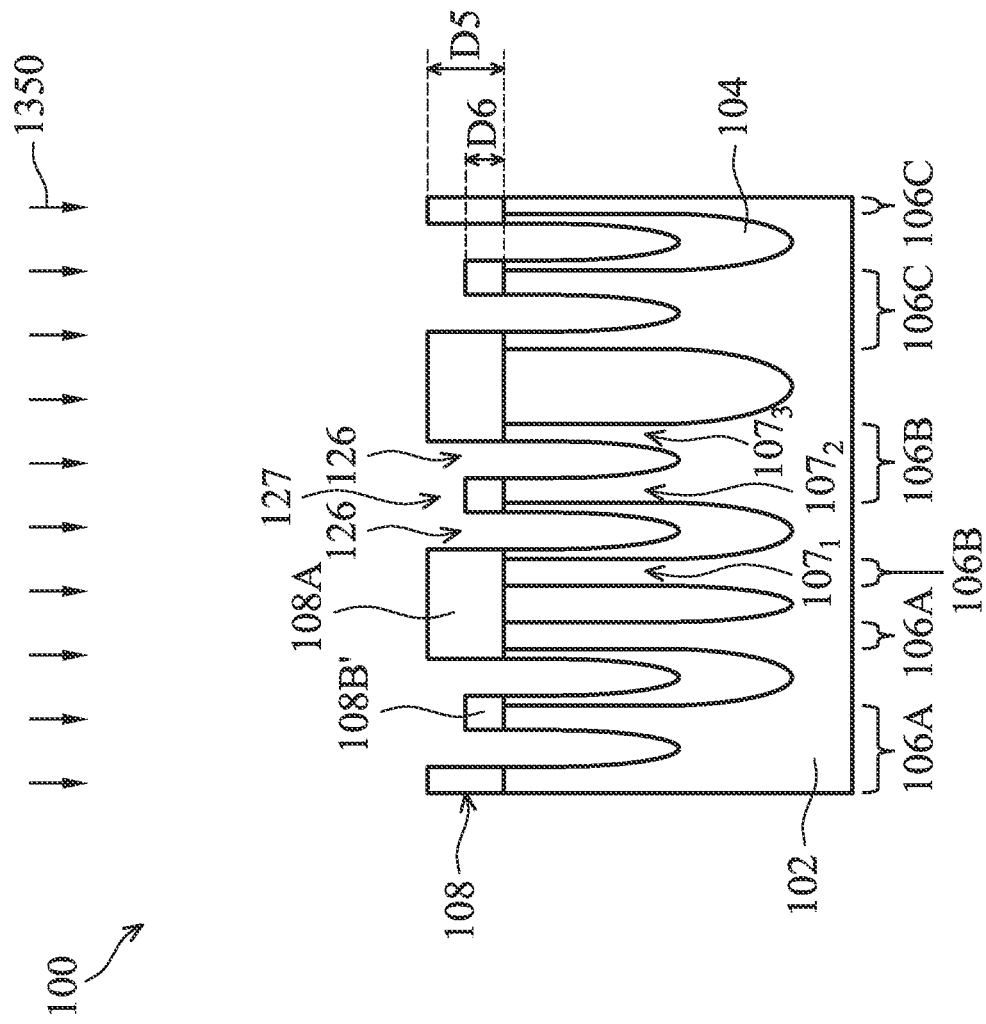

An etching step 1350 is performed on the semiconductor memory structure 100 to remove the mask patterns 110A of the first hard mask layer 110 until the mask patterns 108A of the first hard mask layer 108 are exposed, as shown in FIG. 10, in accordance with some embodiments. In some embodiments, the etching step 1350 is a dry etching in which an etchant such as $O_2$ is used. In some embodiments, the thickness D5 of the mask patterns 108A is greater than the thickness D6 of the mask patterns 108B'. In some embodiments, the ratio of thickness D6 to thickness D5 is in a range from about 0.33 to about 0.5.

Figure 11:
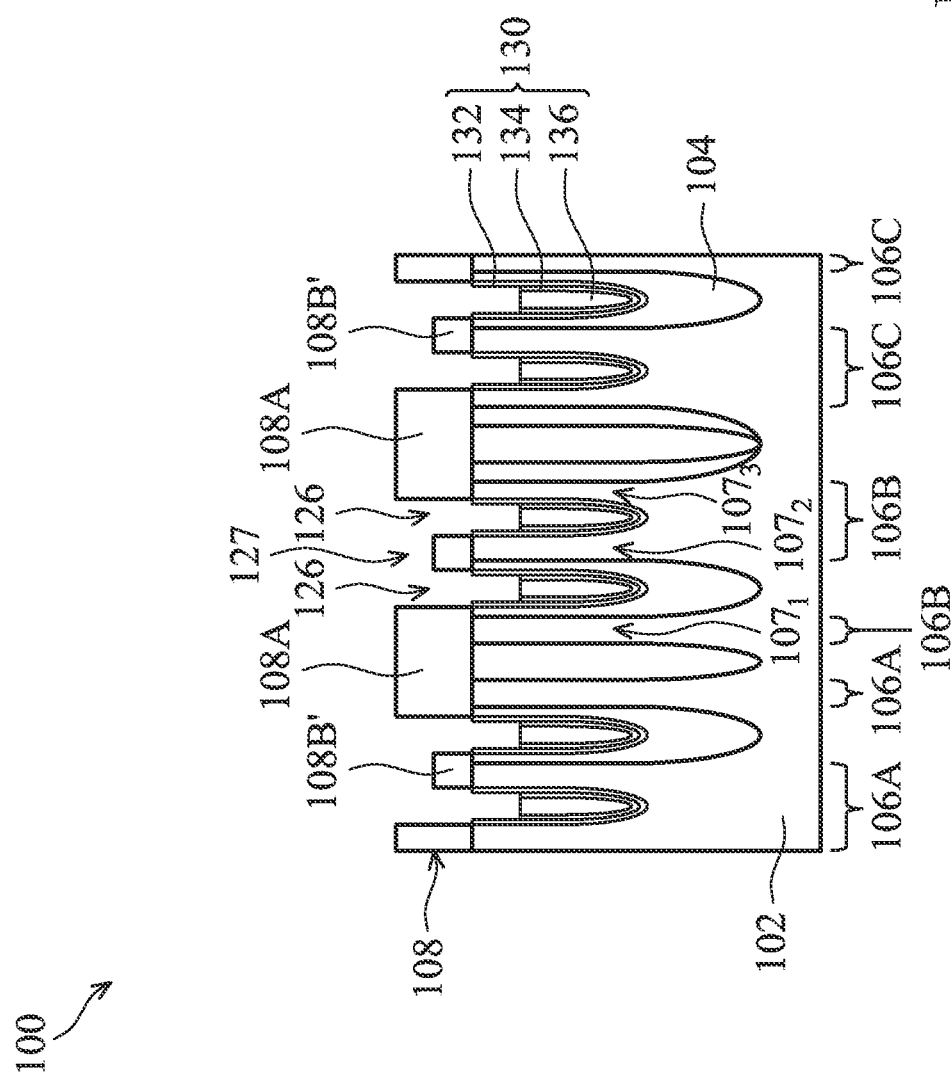

Pairs of word lines 130 are formed in the trenches 126, as shown in FIGS. 1 and 11, in accordance with some embodiments. The word lines 130 may be referred to as buried word lines, in accordance with some embodiments. The word lines 130 are arranged in the direction A1 (FIG. 1), in accordance with some embodiments. The word lines 130 extend along the direction A2 (FIG. 1), in accordance with some embodiments. The word lines 130 and the semiconductor blocks 1071, 1072 and 1073 are laterally alternatingly arranged within one active region 106, in accordance with some embodiments.

The word line 130 includes a gate dielectric layer 132, a gate lining layer 134 and a gate electrode 136, in accordance with some embodiments. In some embodiments, the gate dielectric layer 132 is formed on the surfaces of the semiconductor substrate 102 and isolation features 104 exposed from the trenches 126. In some embodiments, the gate dielectric layer 132 is made of silicon oxide, silicon nitride, silicon oxynitride, or high-k dielectric material. In some embodiments, the gate dielectric layer 132 is formed using thermal oxidation, CVD or ALD.

The gate lining layer 134 is formed on the gate dielectric layer 132, in accordance with some embodiments. In some embodiments, the gate lining layer 134 is made of tungsten nitride (WN), titanium nitride (TiN) or tantalum nitride (TaN). In some embodiments, the gate lining layer 134 is formed using CVD, physical vapor deposition (PVD) or ALD.

The gate electrode 136 is firmed on the gate lining layer 134, in accordance with some embodiments. In some embodiments, the gate electrode 136 is made of a conductive material such as polysilicon, metal or metal nitride. In some embodiments, the gate electrode 136 is firmed using CVD, PVD, or ALD. After materials for the gate dielectric layer 132, the gate lining layer 134 and gate electrode 136 are formed, the gate lining layer 134 and the gate electrode 136 are etched back to expose the upper portions of the trenches 126 again and firm the word lines 130 to fill the lower portions of the trenches 126, in accordance with some embodiments.

Figure 12:
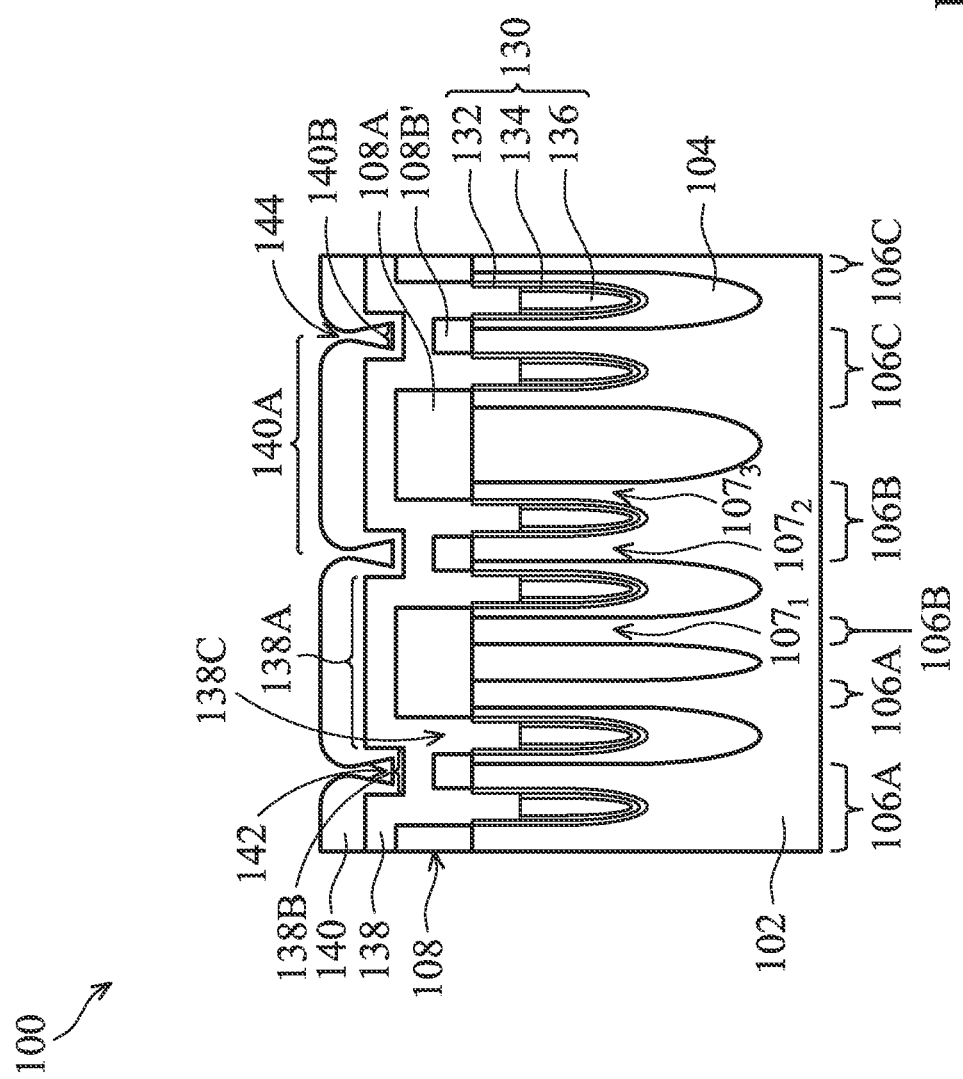

A first capping layer 138 is formed over the semiconductor memory structure 100, as shown in FIG. 12, in accordance with some embodiments. In some embodiments, the first capping layer 138 is made of a dielectric material such a silicon nitride or silicon oxide. In some embodiments, the first capping layer 138 is formed using a deposition process having high step coverage or conformity, e.g., ALD. The first capping layer 138 includes a horizontally extending portion 138A and 138B and vertically extending portions 138C, in accordance with some embodiments.

The vertically extending portions 138C of the first capping layer 138 are filled into the upper portions of the trenches 126 and abut the underlying word lines 130, accordance with some embodiments. The horizontally extending portion of the first capping layer 138 has an alternating-convex-concave profile and extends over the mask patterns 108A and 108B' of the first hard mask layer 108 in accordance with some embodiments. Portions of the first capping layer 138 corresponding to the mask patterns 108A are referred to as convex potions 138A and portions of the first capping layer 138 corresponding to the mask patterns 108B' are referred to as concave potions 138B, in accordance with some embodiments. The upper surfaces of the convex potions 138A are located at a higher level than the upper surfaces of the concave portions 138B. The opening 142 is defined by the two convex potions 138A and the concave portion 138B between them, in accordance with some embodiments.

A second capping layer 138 is formed over the first capping layer 138, as shown in FIG. 12, in accordance with some embodiments. The second capping layer 140 conforms to the profile of the first capping layer 138, which means that the second capping layer 140 also has an alternating-convex-concave profile that extends over the first capping layer 138, in accordance with some embodiments. The second capping layer 140 includes convex potions 140A (corresponding to the convex potions 138A) and concave portions 140B (corresponding to the concave portions 138B), in accordance with some embodiments. The upper surfaces of the convex potions 140A are located at a higher level than the upper surfaces of the concave portions 140B, in accordance with some embodiments.

In some embodiments, the second capping layer 140 is made of a dielectric material such a silicon nitride and/or silicon oxide. In some embodiments, the second capping layer 140 is formed using a deposition process having low step coverage or conformity, e.g., plasma enhanced CVD (PECVD). As such, the convex portions 140 have so much of an overhang that the edges of the upper portions of two adjacent convex portions 140A are close to one another, thereby forming a void 144 with an upwardly tapered profile between the convex portions. In some embodiments, the two adjacent convex portions 140A merge with one another, thereby forming a closed void 144.

Figure 13:
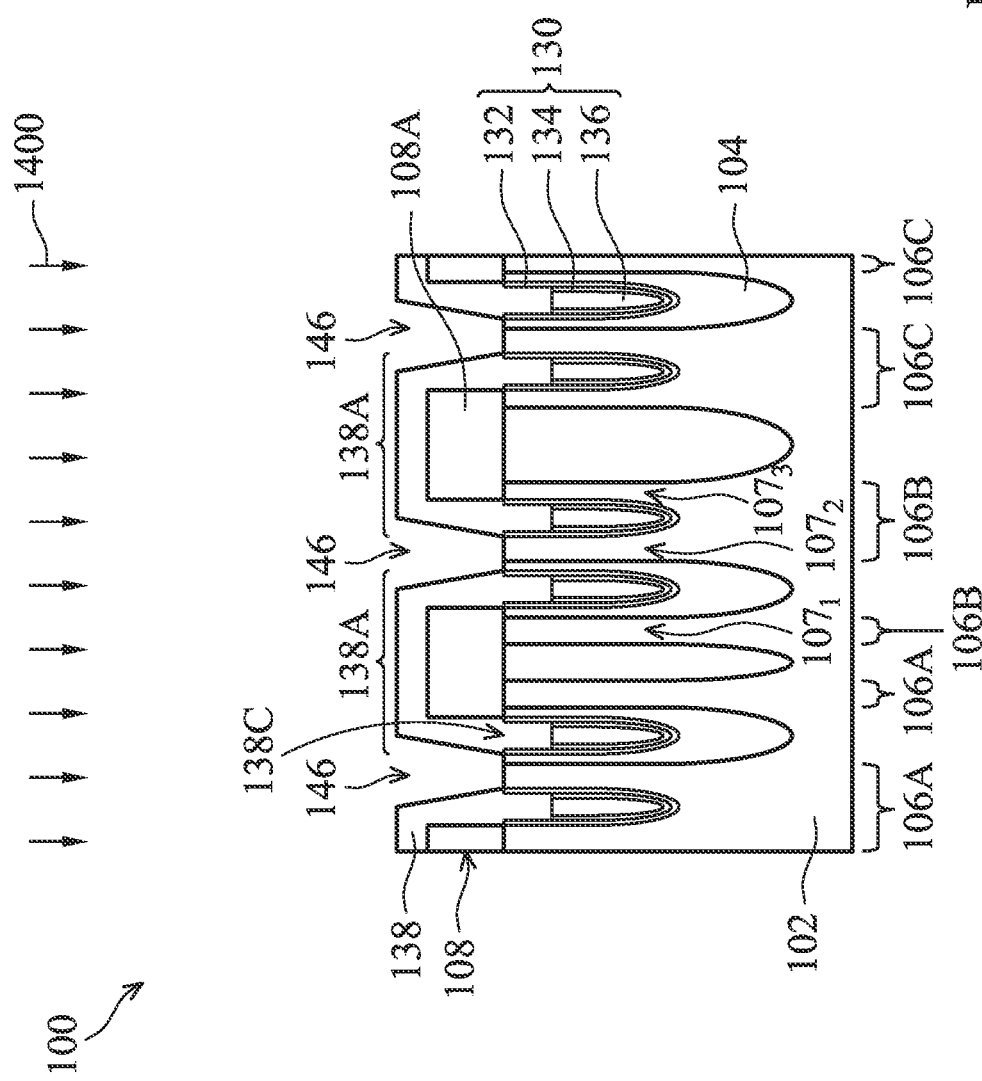

An etching step 1400 is performed on the semiconductor memory structure 100 to form contact openings 146, as shown in FIG. 13, in accordance with some embodiments. The etching step 1400 uses the convex portions 140A of the second capping layer 140 as an etching mask, in accordance with some embodiments. The etchant passes through the voids 144 and vertically removes the concave portions 140B of the second capping layer 140, the concave portions 138B of the first capping layer 138, and the mask patients 108B' of the first hard mask layer 108 until the upper surface of the semiconductor substrate 102 (i.e., the semiconductor block $107_2$), in accordance with some embodiments. In some embodiments, the contact openings 146 expose a portion of the isolation features 104B and a portion of the isolation features 104C. In some embodiments, the contact openings 146 taper downwardly. In some embodiments, the etching step 1400 is a dry etching in which an etchant such as $CF_4$ and/or $CHF_3$ is used. The etching step 1400 is a self-aligned etching step, in accordance with some embodiments. That is, the etching step 1400 is performed without additional mask element (e.g., patterned photoresist layer) formed over the semiconductor memory structure 100 by a photolithography process.

During the etching step 1400, the convex portions 140A of the second capping layer 140 are substantially removed, and the etchant laterally removes portions of the convex portions 138A of the first capping layer 138. This enlarges the voids 144 laterally and vertically, forming the contact openings 146, in accordance with some embodiments. After the etching step 1400, the convex portions 138A of the first capping layer 138 remain on the mask patterns 108A of the first hard mask layer 108 and cover the sidewalls and the upper surfaces of the mask patterns 108A, in accordance with some embodiments.

The embodiments of the present disclosure realize a self-aligned contact opening 146 which is formed by forming capping layers 138 and 140 with a convex-concave profile over mask patterns 108A and 108B' of different thickness. As a result, the etching process 1400 is performed without an additional mask element being formed in a photolithography process. Therefore, the photolithography process may be omitted, which may improve the manufacturing efficiency of the semiconductor memory structure and avoid any issues with overlay shift issue in the photolithography process.

In addition, the desired critical dimensions of the contact opening 146 may be realized by adjusting the shape and size of the void 144. In some embodiments, the shape and size of the void 144 may be adjusted by adjusting the ratio of the thickness of mask pattern 108B' to the thickness mask pattern 108A (i.e., D6/D5) and the parameters used in the deposition processes of the first capping layer 138 and the second capping layer 140. For example, if the ratio of thickness D6 to thickness D5 is too large, the size of the void 144 may be so small that the critical dimensions of the contact opening 146 may be too small. Conversely, if the ratio of the thickness D6 to thickness D5 is too small, the size of the void 144 may be so large that the critical dimensions of the contact opening 146 may be too large.

Figure 14:
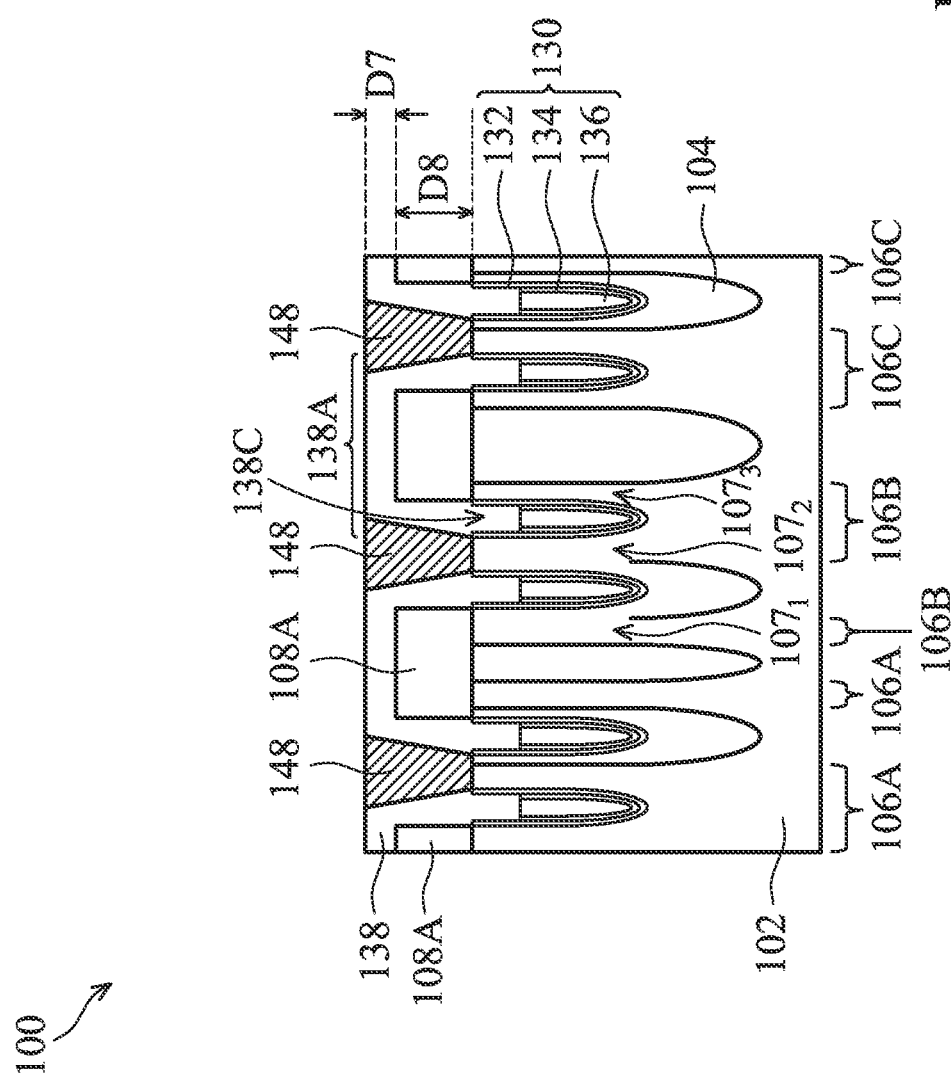

Contact plugs 148 are formed in the contact openings 146, as shown in FIGS. 1 and 14, in accordance with some embodiments. The contact plugs 148 pass through the convex portions 138A of the first capping layer 138 to land on the semiconductor block $107_2$ of the semiconductor substrate 102, in accordance with some embodiments. Doping regions (such as a source region or a drain region) may be formed at the surface of the semiconductor blocks $107_2$ and the contact plugs 148 are in contact with the doping regions. In some embodiments, the contact openings 146 for the contact plugs 148 are formed without a photolithography process, and therefore the contact plugs 148 may be referred to as self-aligned contact plugs. Because the overlay shift issue of a photolithography process is avoided, the short circuit between the contact plugs 148 and subsequently formed contact plugs (e.g., contact plugs to the semiconductor blocks $107_1$ and $107_2$) can be avoided.

In some embodiments, the contact plugs 148 are made of a conductive material such as polysilicon, metal or metal nitride. Metal may be tungsten (W), aluminum (Al), or copper (Cu). Metal nitride may be tungsten nitride (WN), titanium nitride (TiN) or tantalum nitride (TaN). In some embodiments, the contact plugs 148 are formed using CVD, PVD, or ALD and followed by a planarization process such as CMP.

In some embodiments, the first capping layer 138 has a thickness D7 along the upper surfaces of the mask patterns 108A, which is in a range from about 20 nm to about 25 nm. In some embodiments, the mask patterns 108A have a thickness D8 in a range from about 70 nm to about 90 nm. In some embodiments, thickness D7 is less than thickness D8. In some embodiments, the ratio of thickness D7 to thickness D8 is in a range from about 0.25 to about 0.33.

Figure 15:
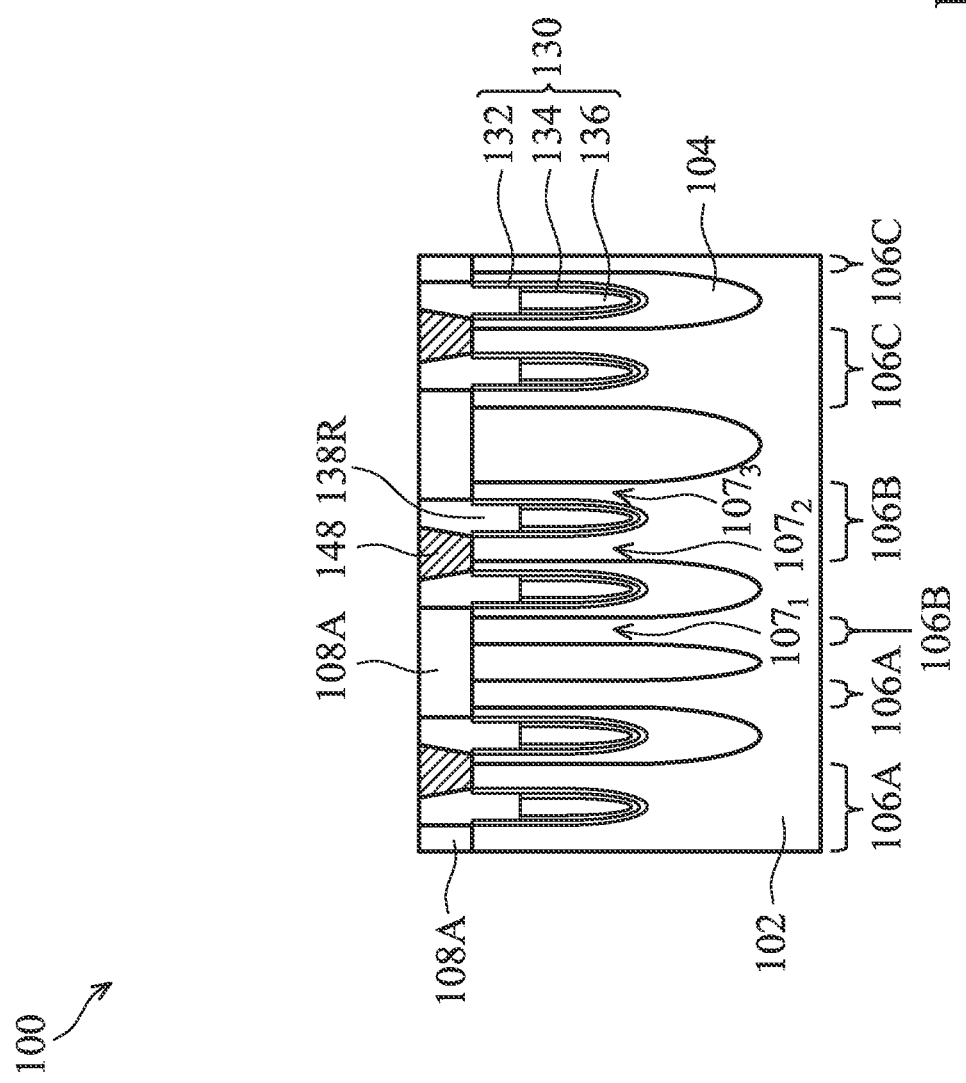

An etching back process is performed on the semiconductor memory structure 100 to partially remove the convex portions 138A of the first capping layer 138 and the contact plugs 148 until the mask patterns 108A are exposed, as shown in FIG. 15, in accordance with some embodiments. The remaining portions of the first capping layer 138 (the convex portions 138A and the vertically extending portions 138C) are denoted as the first capping layer 138R. After the etching back process, the upper surfaces of the contact plugs 148, the upper surface of the first capping layer 138R and the upper surfaces of the mask patterns 108A are substantially coplanar, in accordance with some embodiments. The thickness of the contact plugs 148 are substantially the same as the thickness of the mask patterns 108A, in accordance with some embodiments. The mask patterns 108A are used as an etching stop layer in the etching back process, and thus the contact plugs 148 may be formed with a desired thickness by adjusting the thickness of the mask patterns 108A, in accordance with some embodiments.

Figure 16:
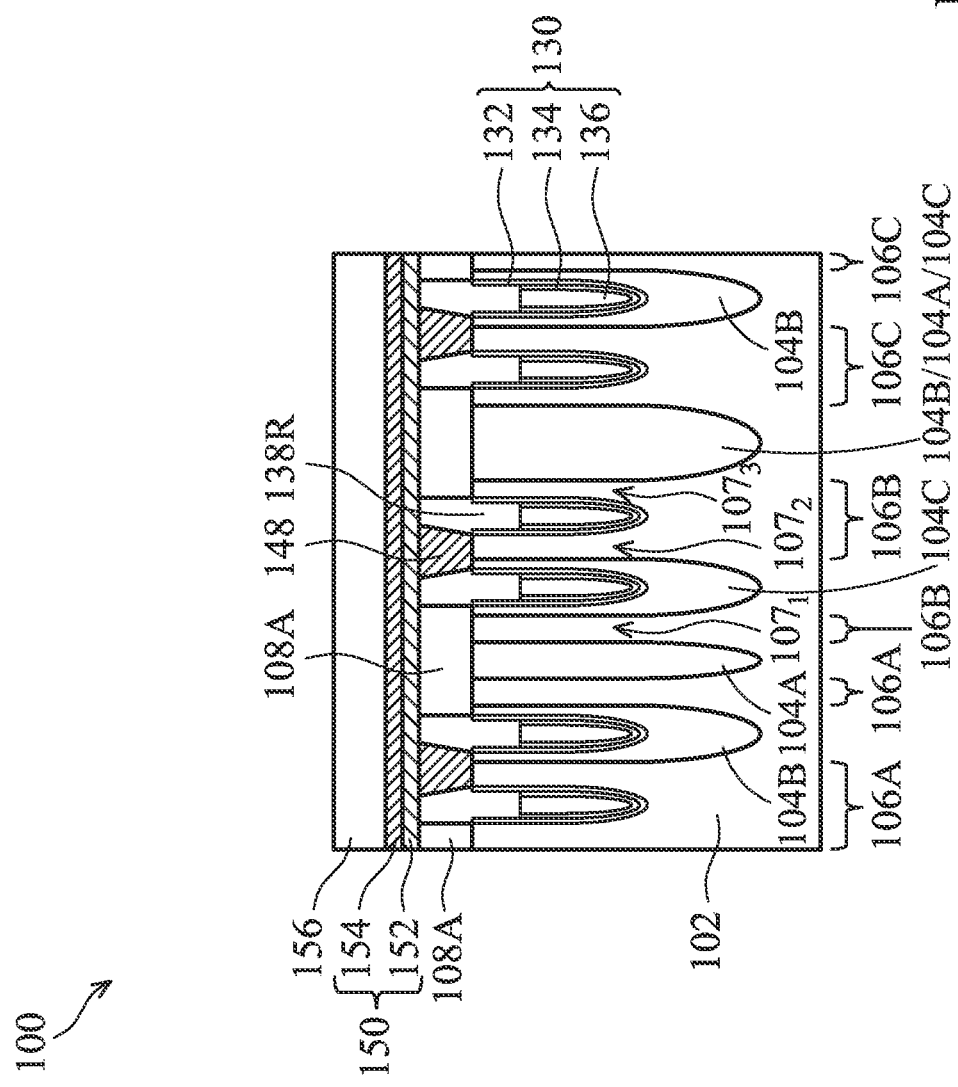

Bit lines 150 are formed over the semiconductor memory structure 100, as shown in FIGS. 1 and 16, in accordance with some embodiments. In some embodiments, the bit lines 150 formed over the semiconductor substrate 102 extend along the direction A1 (FIG. 1). In some embodiments, the bit line 150 includes a barrier layer 150 formed over the contact plugs 148, the first capping layer 138R and the mask patterns 108A and a conductive layer 154 formed over the barrier layer 152. In some embodiments, the barrier layer is made of titanium (Ti), tantalum (Ta), titanium nitride (TiN), and/or tantalum nitride (TaN). In some embodiments, the conductive layer 154 is made of tungsten (W), aluminum (Al), and/or copper (Cu). In some embodiments, the bit lines 150 are formed using deposition and patterning processes.

A dielectric layer 156 is formed over the bit lines 150, as shown in FIG. 16, in accordance with some embodiments. In some embodiments, the dielectric layer 154 is made of silicon nitride, silicon oxide and/or silicon oxynitride and formed using a CVD process.

In some embodiments, additional features (e.g., contacts to the semiconductor blocks $107_1$ and $107_3$, components of a capacitors, etc.) may be formed over the semiconductor memory structure 100 to produce a semiconductor memory device. In some embodiments, the semiconductor memory device is a DRAM.

In accordance with some embodiments of the present disclosure, the semiconductor memory structure 100 includes a plurality of active regions 106 of a substrate 102, and each of the active regions 106 includes semiconductor blocks $107_1$, $107_2$ and $107_3$. The semiconductor memory structure 100 also includes word lines 130 alternating with the semiconductor blocks $107_1$, $107_2$ and $107_3$. The semiconductor memory structure 100 also includes mask patterns 108A covering the semiconductor blocks $107_1$ and $107_3$. The mask patterns 108A also covers portions of the isolation features 104A, 104B and 104C. The semiconductor memory structure 100 also includes first capping layers 138R alongside the mask patterns 108A and the first capping layers 138R extend into the semiconductor substrate 102 to abut the word lines 130. The semiconductor memory structure 100 also includes contact plugs 148 embedded in the first capping layer 138R and landing on the semiconductor blocks $107_2$. The upper surfaces of the contact plugs 148, the upper surface of the first capping layer 138R and the upper surface of the flask patterns 108A are substantially coplanar, in accordance with some embodiments. The semiconductor memory structure 100 also includes bit lines 150 disposed over the contact plugs 148, the first capping layer 138R and the mask patterns 108A. The bit lines 150 are in direct contact with the contact plugs 148, the first capping layer 138R and the mask patterns 108A.

As described above, the embodiments of the present disclosure provide a method for forming a semiconductor memory structure with self-aligned contact plugs. As a result, the overlay shift issue of a photolithography process may be avoided, which may avoid a short circuit between the contact plugs and subsequently formed conductive features (such as contact plugs to the semiconductor blocks $107_1$ and $107_3$). Therefore, the reliability and the manufacture yield of the semiconductor memory device can be increased.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory structure, comprising:
an active region of a semiconductor substrate, comprising a first semiconductor block;
a word line disposed adjacent to the first semiconductor block in the semiconductor substrate;
a mask pattern disposed over the first semiconductor block; and
a capping layer disposed alongside the mask pattern and in the semiconductor substrate to abut the word line, wherein an upper surface of the capping layer is substantially coplanar with an upper surface of the mask pattern.

2. The semiconductor memory structure as claimed in claim 1, wherein the active region comprises a second semiconductor block, and the semiconductor memory structure further comprises:
a contact plug embedded in the capping layer and disposed over the second semiconductor block.

3. The semiconductor memory structure as claimed in claim 2, wherein the upper surface of the mask pattern is substantially coplanar with an upper surface of the contact plug.

4. The semiconductor memory structure as claimed in claim 2, further comprising:
a bit line disposed over the mask pattern, the capping layer and the contact plug.

5. The semiconductor memory structure as claimed in claim 4, wherein the bit line is in direct contact with the contact plug, the capping layer, and the mask pattern.

6. The semiconductor memory structure as claimed in claim 4, wherein the bit line comprises a barrier layer and a conductive layer formed over the barrier layer.

7. The semiconductor memory structure as claimed in claim 6, wherein the barrier layer is formed of Ti, TiN, and/or TaN, and the conductive layer is formed of W, Al, and/or Cu.

8. The semiconductor memory structure as claimed in claim 4, further comprising:
a dielectric layer over the bit line.

9. The semiconductor memory structure as claimed in claim 2, wherein the contact plug is formed of a conductive material comprising polysilicon, metal, or metal nitride.

10. The semiconductor memory structure as claimed in claim 1, further comprising:
an isolation feature disposed in the semiconductor substrate, wherein the mask pattern covers a portion of the isolation feature.

11. The semiconductor memory structure as claimed in claim 10, wherein a portion of the word line is disposed in the isolation feature.

12. The semiconductor memory structure as claimed in claim 1, wherein the capping layer is made of silicon nitride or silicon oxide.

13. The semiconductor memory structure as claimed in claim 1, further comprising;
a second active region adjacent to the first active region, wherein the second active region comprises a third semiconductor block covered by the mask pattern.

14. The semiconductor memory structure as claimed in claim 1, wherein the mask pattern is made of silicon oxide.

15. The semiconductor memory structure as claimed in claim 1, wherein the word line comprises a gate dielectric layer, a gate lining layer, and a gate electrode.

16. The semiconductor memory structure as claimed in claim 1, wherein the semiconductor memory structure is a portion of a DRAM.

17. The semiconductor memory structure as claimed in claim 1, wherein a pair of the word lines divides the active region into the first semiconductor block, a second semiconductor block, and a third semiconductor block, and the second semiconductor block is between the first semiconductor block and the third semiconductor block.

18. The semiconductor memory structure as claimed in claim 17, wherein the word lines and the first semiconductor block, the second semiconductor block, and the third semiconductor block are laterally alternatingly arranged.

19. The semiconductor memory structure as claimed in claim 17, further comprising a capacitor and a contact plug to the first semiconductor block or the third semiconductor block.

* * * * *